(12) United States Patent
King

(10) Patent No.: US 6,212,051 B1
(45) Date of Patent: Apr. 3, 2001

(54) PULSE-WIDTH MODULATOR CURRENT LIMITER

(75) Inventor: William King, Attleboro, MA (US)

(73) Assignee: Acute Power, Inc., Attleboro, MA (US)

( * ) Notice: Subject to any disclaimer, the term of this patent is extended or adjusted under 35 U.S.C. 154(b) by 0 days.

(21) Appl. No.: 09/246,306

(22) Filed: Feb. 8, 1999

(51) Int. Cl.$^7$ ...................................... H02H 3/00
(52) U.S. Cl. ........................ 361/94; 361/93.3; 323/284; 323/288
(58) Field of Search .................. 361/93.1, 93.9, 361/94; 363/50, 74, 25, 19, 21, 23; 323/282, 284–288

(56) References Cited

U.S. PATENT DOCUMENTS

| | | | |
|---|---|---|---|
| 4,465,966 | * | 8/1984 | Long et al. ........................ 323/348 |
| 4,757,433 | * | 7/1988 | Santelmann, Jr. ................... 363/19 |
| 5,892,665 | * | 4/1999 | Matsumoto et al. ................ 363/56 |
| 5,903,452 | * | 5/1999 | Yang .................................... 363/97 |
| 5,910,890 | * | 6/1999 | Hansen et al. ...................... 363/41 |

\* cited by examiner

*Primary Examiner*—Josie Ballato
*Assistant Examiner*—Kim Huyuh
(74) *Attorney, Agent, or Firm*—Stephen G. Matzuk

(57) ABSTRACT

An efficient, economical circuit which is easily added to existing modular or integrated pulse-width modulator circuits, e.g. switching power supply regulator circuits, having an fault comparitor which disables the pulse-width modulator when an overload error condition is detected for a time which exceeds a first RC time constant, and restoring the operation of the pulse-width modulator after a second R'C time. The differing RC and R'C time constants are provided by varied resistor circuit paths established by the state of the fault comparitor. The topology and economy of parts provide a current limiter which facilitates miniaturization and circuit integration.

9 Claims, 2 Drawing Sheets

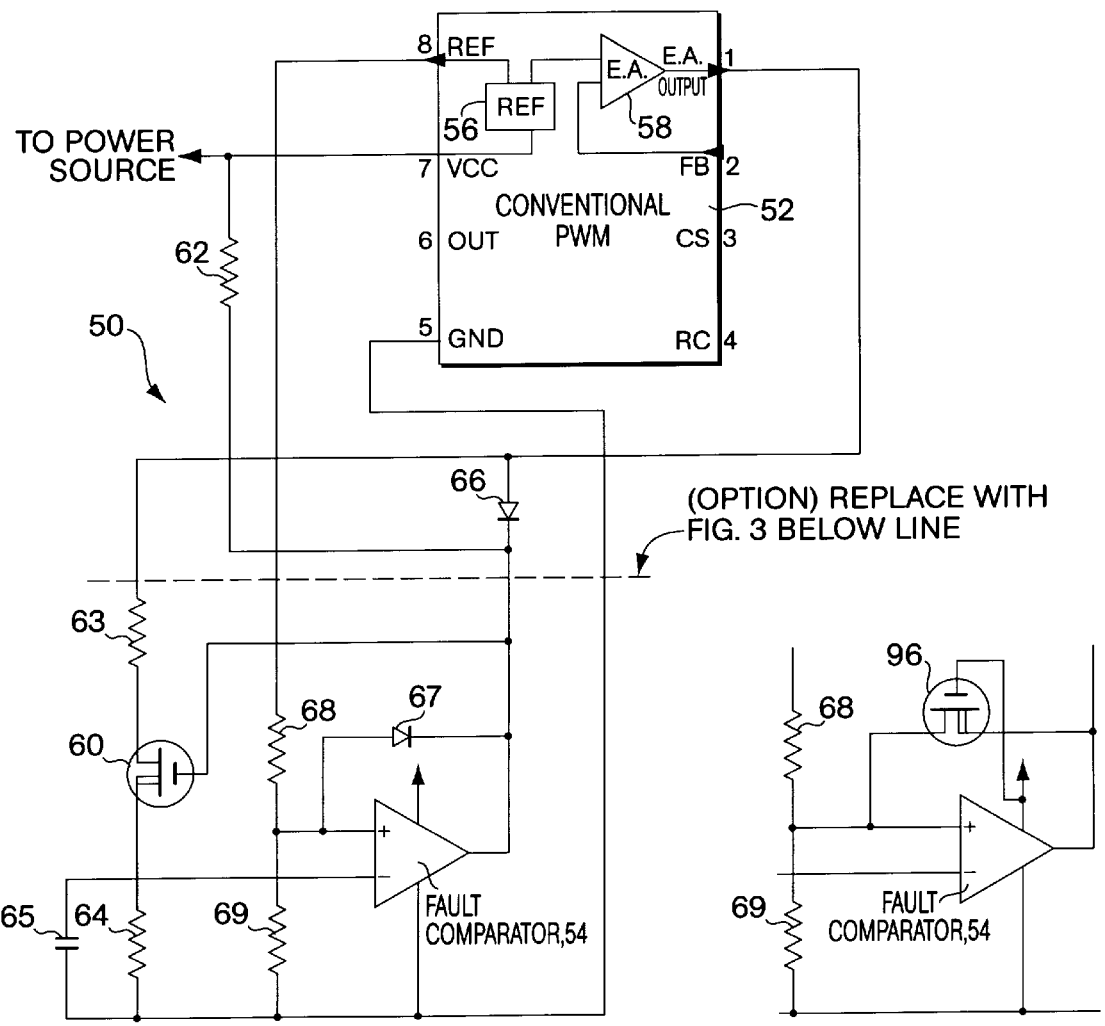
Fig. 1
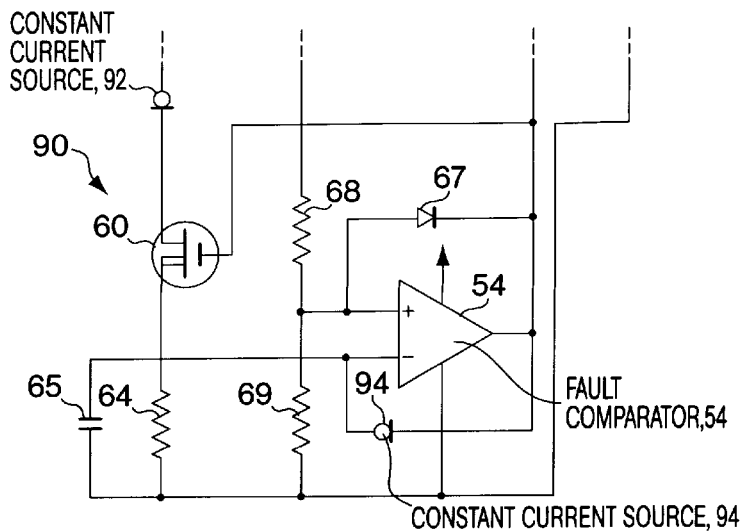
Fig. 3
Fig. 3A

PULSE-WIDTH MODULATOR CURRENT LIMITER

FIELD OF THE INVENTION

The present invention relates to switching circuit current limiters, in particular, to current limiters used in combination with integrated circuit pulse-width modulator driver circuits.

BACKGROUND OF THE INVENTION

Prolonged short-circuit conditions of switching power supplies excessively stress the power components, resulting in premature and avoidable failure. Short circuit conditions are detected by a prolonged high level error amplifier output signal, which had been used to trigger a sequence of one-shot multi-vibrators to quench the operation of the pulse-width modulator driver circuit. Alternate embodiments count pulse periods after an overload or shorted condition is detected. Either implementation provides a fixed sequence of operation of serially operating or incrementing circuits. Such circuits also require a substantial number of components whose type and values make miniaturization and integration difficult if not impossible.

SUMMARY OF THE INVENTION

The pulse-width modulator (PWM) current limiter circuit according to the present invention is easily included with or appended to exiting PWM circuitry wherein the error amplifier output signal is used to initiate a driver shut-down, and to receive the signal that causes the driver shut-down. The error amplifier output signal is used to charge an RC circuit after which a comparator provides an output signal coupled to the error amplifier output, causing it to be pulled to a state which inhibits the operation of the PWM driver. Simultaneously, the error amplifier output causes a change in topology so that a different R'C circuit is formed, and a different threshold (reference) voltage is provided so that a different and longer time period is provided during which the PWM driver operation is inhibited, after which the PWM driver is restarted for at least the durations provided by the first RC circuit.

BRIEF DESCRIPTION OF THE DRAWING

These and further features of the present invention will be better understood by reading the following Detailed Description together with the Drawing, wherein FIG. 1 is a schematic diagram of one embodiment of the present invention;

FIG. 3 is a schematic diagram portion of an alternate embodiment according to the present invention; and FIG. 3A is schematic diagram of an alternate embodiment of portions of the circuits of FIG. 1 and 3.

DETAILED DESCRIPTION OF THE INVENTION

Figure 2A:
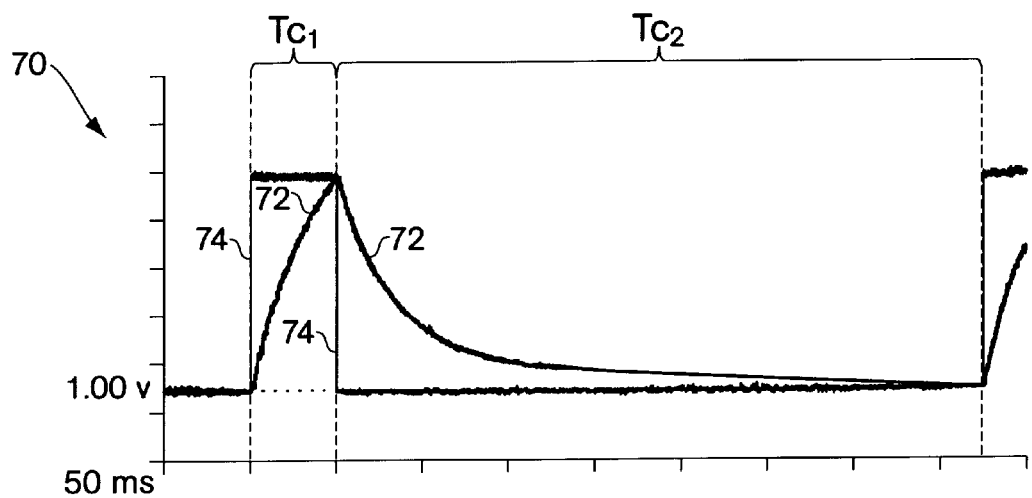
FIG. 2A is a waveform of the fault comparitor input of the embodiment of FIG. 1 showing differing time constants.

The current limited Pulse-Width Modulator (PWM) circuit 50 according to the present invention is shown in FIG. 1 to include a conventional PWM driver 52, e.g. a GMT Microelectronics Corporation, Norristown, Pa., part no. GMT38HC43, and omitting the connection to the controlled switching device and the source power supply which may be provided by the driver manufacturer's reference and application materials, and other information generally available.

Upon start-up, the PWM driver 52 provides a reference 56 voltage (e.g. +5Vdc) to the non-inverting reference input of a fault comparitor 54, which provides an open/off state since the positive input is then at a higher voltage than the inverting input, which is connected to an RC circuit that is initially at or near zero volts. Thus the output of the fault comparitor, and the circuit 50, is not susceptible to pre-triggering due to the capacitance at the negative input of the fault comparitor. A FET 60 (e.g. 2N7002) is controlled by the fault comparitor 54, which in the present embodiment, provides an open (non-conducting) output state when off. With the output of the fault comparitor 54 open (at start-up), the gate of FET (or equivalent transistor) 60 is enhanced via resistor 62 which is connected to a positive voltage Vcc provided by the PWM driver 52, and causes the conduction of the FET 60 to switch "on" and connect the output of the error amplifier 58 of the PWM driver 52 to the sense line of the fault (e.g. prolonged overload) detection circuit 50. Under normal operations when a fault has not been sensed, the fault comparitor output remains high/off.

In normal quiescent operation and with the power applied and the FET 60 switched on, the error amplifier 58 output of the PWM driver 52 is connected to a voltage divider comprising resistors 63 and 64, the junction of which is connected to a capacitor 65 and the inverting input of the fault comparitor 54. In normal operation, the error amplifier 58 output of the PWM driver 52 operates in a voltage range such that the level at which the divided level (inverting input of the fault comparitor 54) created by resistors 63 and 64 does not cross above the reference (non-inverting) input of the fault comparitor 54. Optional resistor 69 is added to scale the reference 56 signal to the fault comparitor 54 in the event that the e/a output is in a different range. Further alternately, the reference 56 signal may be increased as desired by appropriate structures. When a fault and/or the PWM driver exceeds its intended operating range (or other internal faults), the PWM error amplifier output will rise to a level in which the divided input to U1 will cross the reference input, at a time determined by the time constant of an RC circuit comprising resistors 63, 64 and capacitor 65. When voltage at the inverting input crosses the voltage of the non-inverting input of the fault comparitor 54, its output switches to the on/low state, pulling the error amplifier output of the PWM driver 52 low (via diode 66) and terminating the PWM driver output (and also the power switching of the connected switching device, not shown). In addition to isolating the error amplifier output, diode 66 minimizes the effects of external capacitance at the error amplifier 58 output. Also, when the output of the fault comparitor 54 is on/low, the FET 60 switch is opened and the sense line disconnected, diode 67 is forward biased pulling the non-inverting input of the fault comparitor 54 to a lower (approximately +0.7 Vdc). Immediately after the time the inverting input voltage exceeds the non-inverting input voltage, the inverting input is at the reference voltage, e.g. +5.0 Vdc in this case, and the non-inverting input voltage is now at a lower voltage, e.g. +0.7 Vdc (as further adjusted by the fault comparitor input offset voltage and the saturation voltage of the fault comparitor output transistor, during which the PWM driver 52 is held "off" until the inverting input decays to below the lower voltage, e.g. +0.7 Vdc, according to an RC time constant comprising now only of resistor 64 and capacitor 65 (and any input resistance of the fault comparitor 54) any at which point the comparitor output opens (goes high), releasing the PWM driver error amplifier 56 output, turning the FET 60 on and allowing the PWM driver 52, associated circuitry, and the current limiter circuitry described according to the present invention, to return to normal operation. If the fault condition remains, the described cycle recurs until the fault condition is removed.

A more detailed examination of the full timing cycle from the point at which the fault comparitor 54 releases the PWM driver 52 error amplifier output under a fault condition (e.g. a full fault or power-up condition), a reference (+5.0 Vdc) voltage appears at the non-inverting input of the fault comparitor 54, FET 60 is turned on by a high signal at the output of the fault comparitor, via the resistor 62 (or by a high output if the fault comparitor has an active output pull-up). Accordingly, capacitor 65 is charged to a level determined by the voltage divider comprising resistors 63, 64 as well as the FET 60 "on" resistance, and minimally by the input resistance of the fault comparitor 54, during a first time constant Tc1. When the voltage across the capacitor 65 and thus at the inverting input of the fault comparitor 54 reaches the reference voltage, e.g. +5.0 Vdc, the output of the fault comparitor 54 switches to an "on" or low state and diode 67 is forward biased causing the non-inverting input of the fault comparitor 54 to be reduced to a lower voltage, generally that of the saturation voltage of the fault comparitor 54 internal output device and the diode 67 voltage drop, typically about +0.7 Vdc in this embodiment. With the drop in fault comparitor 54 output, the FET 60 opens the path from the PWM driver 52 error amplifier 58 output to the sense line (i.e. the end of resistor 64 connected to FET 60) and capacitor 65 discharges to a different level approximately that of the current level of the inverting input (+0.7 Vdc) of the fault comparitor 54 according to a different time constant Tc2 determined by resistor 64, capacitor 65 and possibly by the input resistance of the fault comparitor 54. When the capacitor 65 discharges to below the then level (+0.7 Vdc) of the non-inverting input of the fault comparitor 54, the output returns to the high or off state, turning on FET 60, releasing the PWM driver error amplifier 58 output, and so on and the cycle starts again until the triggering fault condition is removed. The hysteresis provided by the changing of the level of the fault comparitor 54 non-inverting input via diode 67 as permitted by reference series resistor 68, the series switch 60, and the two time constants Tc1 and Tc2 selected by provides for large and selectable off-to-on ratio of the PWM driver 54.

Graphical representation 70 of the differing time constants Tc1 and Tc2 is shown by waveform trace 72, which also represents the voltage at the inverting input of the fault comparitor 54. The voltage at the non-inverting input is represented by waveform trace 74, showing a higher level during the period of Tc1 and a lower level during the period of Tc2, as explained above.

Graphical representation 80 is also provided of the fault comparitor 54 output and the PWM driver 52 output by waveform traces 82 and 84, respectively.

Figure 2B:
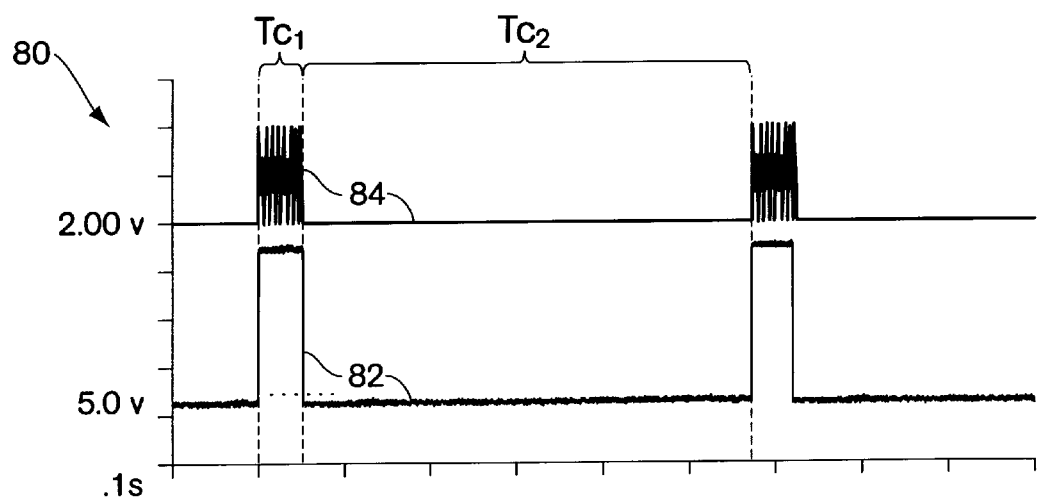
FIG. 2B are waveforms of the comparator and PWM driver output according to the embodiment of FIG. 1.

An alternate embodiment 90 is shown in FIG. 2, showing a portion of the circuit 50 wherein resistor 63 is replaced by a constant current source 92 and a constant current source 94 is added between the capacitor 65 (connected to the inverting input of the fault comparitor 54) and the error amplifier 58 output of fault comparitor 54. Typically, the constant current source 92 is used to charge capacitor 65 when FET 60 is on and is selected to provide a current selected to charge the capacitor 65 to the reference voltage threshold during the selected period corresponding to Tc1, while the second current source 94 is selected to provide a lower discharge current, and therefore slower discharge over a period corresponding to Tc2 when current is not flowing through current source 92. Typically, the current provided by current source 92 is an order of magnitude greater than the current provided by current source 94. In other implementations, current source 94 is optional and omitted.

Further alternate, equivalent components may be substituted for various components, e.g. the PWM 52, the FET switch 60, the diode 67, the fault comparitor to provide the individual and combined structure as taught herein. Also, as shown in FIG. 3A, diode 67 may be replaced in the embodiments of either FIG. 1 or FIG. 3 by an active device, such as FET 96, typically a 2N7002, which turns "on" when its source is pulled low by the output of the fault comparitor 54. Further modifications and substitutions by one of ordinary skill in the art according the present invention is within the scope of the present invention, which is not to be limited except by the claims which follow.

What is claimed is:

1. A current limited PWM circuit comprising:
    a PVT driver providing a reference voltage and an error amplifier output;
    a fault comparator comprising an amplifier having an inverting and a non-inverting input and an output, said non-inverting input being connected to received said reference voltage;
    a switching device connected to receive said error amplifier output and selectively provide a signal path to a first resistance according to the output of said fault comparator;
    a second resistance and a capacitance connected to said first resistance and to said inverting input of said fault comparator to provide a first RC time-constant corresponding to the combination of said first resistance and said second resistance with said capacitance, being charged to a potential of said error amplifier output via said switching device when in an on state, and a second RC time constant of discharge according to the second resistance and said capacitance only, wherein
    said output of said fault comparator is connected to cause said error amplifier output to be placed at a level wherein the PWM driver output is disabled from providing a driving signal when the signal at said inverting input exceeds the signal at said non-inverting input.

2. The current limiter PWM circuit of claim 1, wherein said fault comparitor output is connected to said error amplifier output by a diode which provides a current flow when said fault comparitor is in an on state.

3. The current limiter PWM circuit of claim 1, wherein said non-inverting input of said fault comparator device is connected to the reference voltage by a resistance and connected to the fault comparator output by a diode operable to cause the non-inverting input to be diminished in amplitude when said fault comparator is in an on state.

4. A current limited PWM circuit, comprising:
    a PWM driver providing a reference voltage and an error amplifier output;
    a fault comparator having a first and a second input and an output, said first input being connected to received said reference voltage;
    a selectable time constant circuit connected to receive said error amplifier output and provide a signal to said fault comparator second input according first time constant before said signal exceeds said reference voltage and provides said signal to said fault comparator according to a second time constant after said signal exceeds said reference voltage, wherein said output of said fault comparator is connected to cause said error amplifier output to be placed at a level wherein the PWM driver is disabled from providing a driving signal when the signal at said second input exceeds the signal at said first input.

5. The current limiter PWM circuit of claim 4, including means for reducing the reference voltage at said fault comparator first input to a lower level after the voltage at said second input exceeds the initial fault comparator reference voltage.

6. The current limiter of claim 5, wherein said selectable time constant circuit provides a diminishing signal to said fault comparator second input after said second input exceeds the reference voltage, said fault comparitor output changes when the voltage received by said second input of said fault comparitor is less than said lower level, releasing said error amplifier output the voltage at said first input of said fault comparitor to return to the reference voltage.

7. A current limited PWM circuit, comprising:

a PWM driver providing voltage, a reference voltage and an error amplifier output;

a fault comparator having a first and a second input and an output, said first input being connected to received said reference voltage;

a selectable time circuit connected to receive said error amplifier output and provide a signal to said fault comparitor second input according first rate of change before said signal exceeds said reference voltage and provides said signal to said fault comparitor according to a second time rate of change after said signal exceeds said reference voltage, wherein said output of said fault comparitor is connected to cause said error amplifier output to be placed at a level wherein the PWM driver output signal is disabled from providing a driving signal when the signal at said second input exceeds the signal at said first input.

8. The circuit of claim 7, wherein said first rate of change is provided by a capacitor and a first constant current flow provided by a means for providing a selectable current flow including a controllable first current source operable according to said fault comparitor output.

9. The circuit of claim 8, wherein said means for providing a selectable current source includes a second current source providing a flow of current to said capacitor opposite that of said controllable first current source.

\* \* \* \* \*